(12) United States Patent
Higuchi et al.

(10) Patent No.: US 11,050,403 B2
(45) Date of Patent: Jun. 29, 2021

(54) CIRCUIT MODULE, NETWORK MODULE, AND IN-VEHICLE ELECTRONIC DEVICE

(71) Applicant: Murata Manufacturing Co., Ltd., Kyoto-fu (JP)

(72) Inventors: Tarou Higuchi, Nagaokakyo (JP); Yoshihiro Imanishi, Nagaokakyo (JP); Yasushi Saito, Nagaokakyo (JP); Shun Takai, Nagaokakyo (JP); Miyuki Nojiri, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 27 days.

(21) Appl. No.: 16/556,142

(22) Filed: Aug. 29, 2019

(65) Prior Publication Data

US 2019/0386630 A1 Dec. 19, 2019

Related U.S. Application Data

(63) Continuation of application No. PCT/JP2018/004620, filed on Feb. 9, 2018.

(30) Foreign Application Priority Data

Mar. 15, 2017 (JP) .............................. JP2017-049275

(51) Int. Cl.
*H03H 7/42* (2006.01)
*H03H 7/01* (2006.01)
(Continued)

(52) U.S. Cl.
CPC ............ *H03H 7/427* (2013.01); *H01F 17/04* (2013.01); *H03H 7/06* (2013.01); *H03H 7/09* (2013.01);
(Continued)

(58) Field of Classification Search
CPC ........... H03H 7/427; H03H 2001/0085; H03H 1/0007
(Continued)

(56) References Cited

U.S. PATENT DOCUMENTS

2015/0318599 A1* 11/2015 Ivanov ..................... H04B 1/12
375/296
2017/0041044 A1 2/2017 Ivanov et al.
2017/0345560 A1* 11/2017 Tomonari ............ H01F 27/2823

FOREIGN PATENT DOCUMENTS

CN 101431347 A 5/2009
JP H07-086863 A 3/1995
(Continued)

OTHER PUBLICATIONS

International Search Report issued in PCT/JP2018/004620; dated Mar. 13, 2018.
(Continued)

*Primary Examiner* — Rakesh B Patel
(74) *Attorney, Agent, or Firm* — Studebaker & Brackett PC

(57) ABSTRACT

A circuit module includes a wiring board on which are provided a ground plane, a signal line, and a conductive pattern for connection to an outer conductor of a coaxial cable including an inner conductor and the outer conductor. A common-mode choke coil is mounted on the wiring board such that one of coils of the common-mode choke coil connects the ground plane and the conductive pattern and that the other coil is inserted in the signal line. A communication element is mounted on the wiring board and includes a first signal terminal and a second signal terminal. The first signal terminal is connected to the common-mode choke coil via the signal line, and the second signal terminal is connected to the ground plane. A first capacitor is inserted
(Continued)

in series in the signal line between the common-mode choke coil and the first signal terminal.

20 Claims, 10 Drawing Sheets

(51) Int. Cl.
*H01F 17/04* (2006.01)
*H03H 7/06* (2006.01)
*H03H 7/09* (2006.01)
*H03M 9/00* (2006.01)
*H01F 17/00* (2006.01)

(52) U.S. Cl.
CPC ....... *H03M 9/00* (2013.01); *H01F 2017/0093* (2013.01)

(58) Field of Classification Search
USPC .................................................. 333/181, 185
See application file for complete search history.

(56) References Cited

FOREIGN PATENT DOCUMENTS

| | | |
|---|---|---|
| JP | H07-297035 A | 11/1995 |
| JP | 2002-134329 A | 5/2002 |
| JP | 2005-235429 A | 9/2005 |
| JP | 2010-219716 A | 9/2010 |
| JP | 2017-004703 A | 1/2017 |
| JP | 2017-168694 A | 9/2017 |
| WO | 2006/098076 A1 | 9/2006 |
| WO | 2015/107922 A1 | 7/2015 |

OTHER PUBLICATIONS

Written Opinion issued in PCT/JP2018/004620; dated Mar. 13, 2018.
DS90UB913A-CXEVM & DS90UB914A-CXEVM User's Guide, Texas Instruments, Revised Apr. 2016, online, URL: http://www.tij.co.jp/jp/lit/ug/snlu135b/snlu135b.pdf.
Camera system solution for automobile, Product Applications and Design Tools and Software Inquiries and Support Free Samples and Reference Information, Texas Instruments, pp. 1-6, Sep. 28, 2013.
Texas Instruments.; "Sending Power Over Coax in DS90UB913A Designs"; Application report; Jun. 2014; pp. 1-3; URL: https://www/ti.com/lit/an/snla224/snla224.pdf; Texas Instruments.
An Office Action; "Notification of Reasons for Refusal," mailed by the Japanese Patent Office dated Jul. 7, 2020, which corresponds to Japanese Patent Application No. 2019-505778 and is related to U.S. Appl. No. 16/556,142 with English language translation.
An Office Action; "Notice of Reasons for Refusal," mailed by the Japanese Patent Office dated Nov. 17, 2020, which corresponds to Japanese Patent Application No. 2019-505778 and is related to U.S. Appl. No. 16/556,142 with English language translation.

* cited by examiner

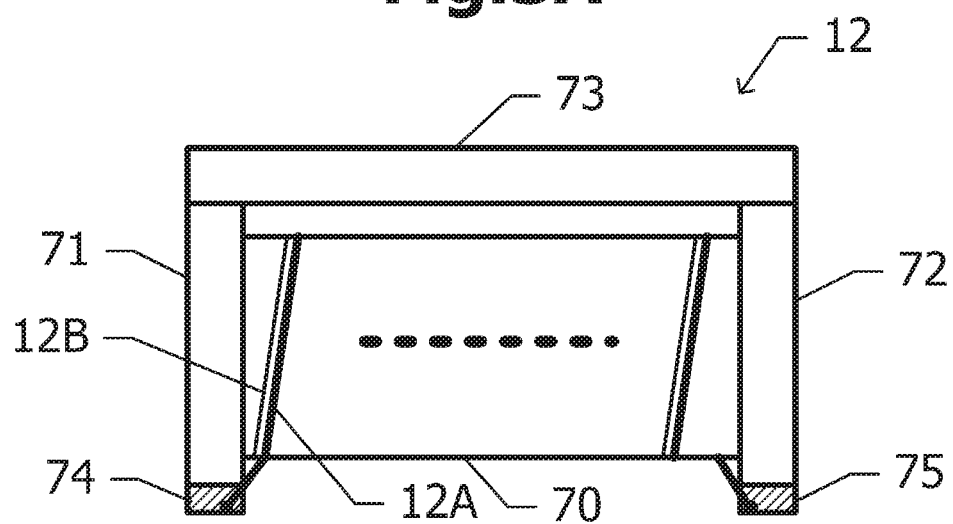
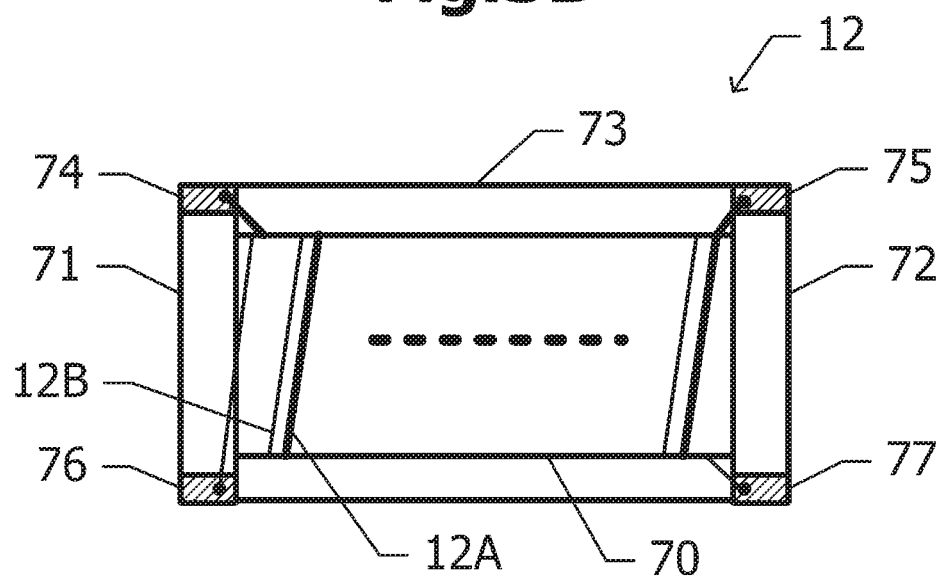

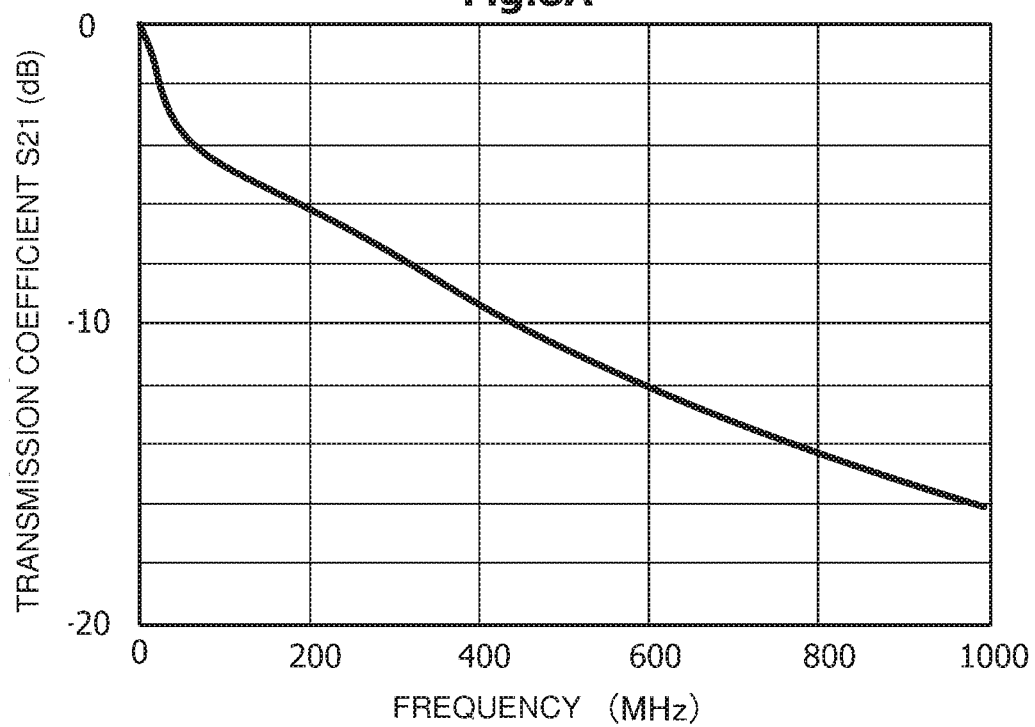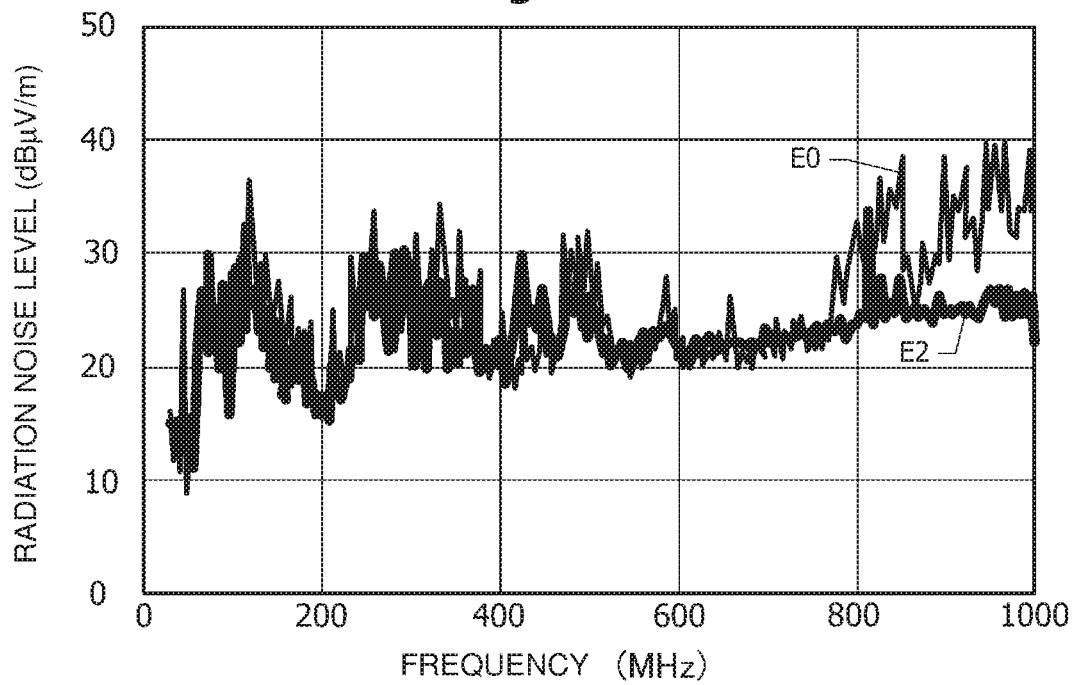

CIRCUIT MODULE, NETWORK MODULE, AND IN-VEHICLE ELECTRONIC DEVICE

CROSS-REFERENCE TO RELATED APPLICATIONS

This application claims benefit of priority to International Patent Application No. PCT/JP2018/004620, filed Feb. 9, 2018, and to Japanese Patent Application No. 2017-049275, filed Mar. 15, 2017, the entire contents of each are incorporated herein by reference.

BACKGROUND

Technical Field

The present disclosure relates to circuit modules, network modules, and in-vehicle electronic devices, on each of which a common-mode choke coil is mounted.

Background Art

Recently, functionalities of a vehicle are being improved by electronic control. Objects of the electronic control include various systems such as a following distance control system, a lane keeping system, a collision prevention system, and the like. In order to carry out such electronic control, an in-vehicle electronic control unit (in-vehicle ECU) and a plurality of in-vehicle cameras are installed in a vehicle. Image data obtained by the plurality of in-vehicle cameras are collected at the in-vehicle ECU, and the in-vehicle ECU performs image analysis.

Because many communication cables are needed for sending image data from the plurality of in-vehicle cameras to the in-vehicle ECU, there is demand for reduction of cost and weight of the communication cable. As a transmission system that sends and receives various signals between the in-vehicle camera and the in-vehicle ECU, supplies power to the in-vehicle camera, and enables reduction of cost and weight of the communication cable, a SerDes transmission system is proposed.

DS90UB913A-CXEVM & DS90UB914A-CXEVM User's Guide (http://www.tij.co.jp/jp/lit/ug/snlu135b/snlu135b.pdf) is a user's guide of FPD-Link III evaluation board, which is one of SerDes circuit modules that perform reciprocal conversion between serial data and parallel data. On page 21 of the User's Guide, a peripheral circuit of a serializer is disclosed, and on page 25, a peripheral circuit of a deserializer is disclosed. A signal sent from the serializer is transmitted through a coaxial cable and received by the deserializer. In some cases, a low-speed signal having a frequency between about 10 kHz and 50 MHz inclusive is sent from the deserializer and received by the serializer. Further, power for driving a serializer circuit module is supplied to the serializer circuit module from a deserializer circuit module through the coaxial cable.

A high-frequency-cut inductor and a high-frequency-cut ferrite bead are inserted in a power supply line, and a DC-cut capacitor is inserted in a signal line.

SUMMARY

When common-mode noise leaks from the serializer circuit module or the deserializer circuit module to a coaxial cable, an electromagnetic noise is radiated from the coaxial cable. Further, when the coaxial cable picks up noise at outside and common-mode noise propagates into a circuit inside a board, the circuit malfunctions in some cases. However, at present, in the SerDes transmission system that uses a coaxial cable, a measure against the common-mode noise has not been revealed.

Accordingly, the present disclosure provides a circuit module, a network module, and an in-vehicle electronic device, each of which enables the improvement of electromagnetic compatibility (EMC) in a signal transmission system that uses a coaxial cable.

According to an aspect of the present disclosure, a circuit module is provided including a wiring board on which a ground plane, a signal line, and a conductive pattern to be connected to an outer conductor of a coaxial cable are provided, the coaxial cable including an inner conductor and the outer conductor; and a common-mode choke coil mounted on the wiring board in such a way that one of coils connects the ground plane and the conductive pattern and another of the coils is inserted in the signal line. The circuit module further includes a communication element including a first signal terminal and a second signal terminal, the first signal terminal being connected to the common-mode choke coil via the signal line, the second signal terminal being connected to the ground plane; and a first capacitor inserted in series in the signal line between the common-mode choke coil and the first signal terminal.

Placing a common-mode choke coil enables the reduction of common-mode noise leakage from a circuit on a wiring board to a coaxial cable. Further, this enables the suppression of propagation of common-mode noise picked up by the coaxial cable and propagated into the circuit on the wiring board.

BRIEF DESCRIPTION OF THE DRAWINGS

FIG. 3A and FIG. 3B are an elevation view and a bottom view of a common-mode choke coil to be used in the serializer circuit module and the deserializer circuit module according to the first example, respectively;

FIG. 8A is a graph illustrating a filter characteristic of a normal-mode noise filter mounted on a serializer circuit module used in an evaluation experiment, and FIG. 8B is a graph illustrating a result of the evaluation experiment;

DETAILED DESCRIPTION

First Example

A circuit module according to a first example is described with reference to the drawings from FIG. 1 to FIG. 6B.

Figure 1:
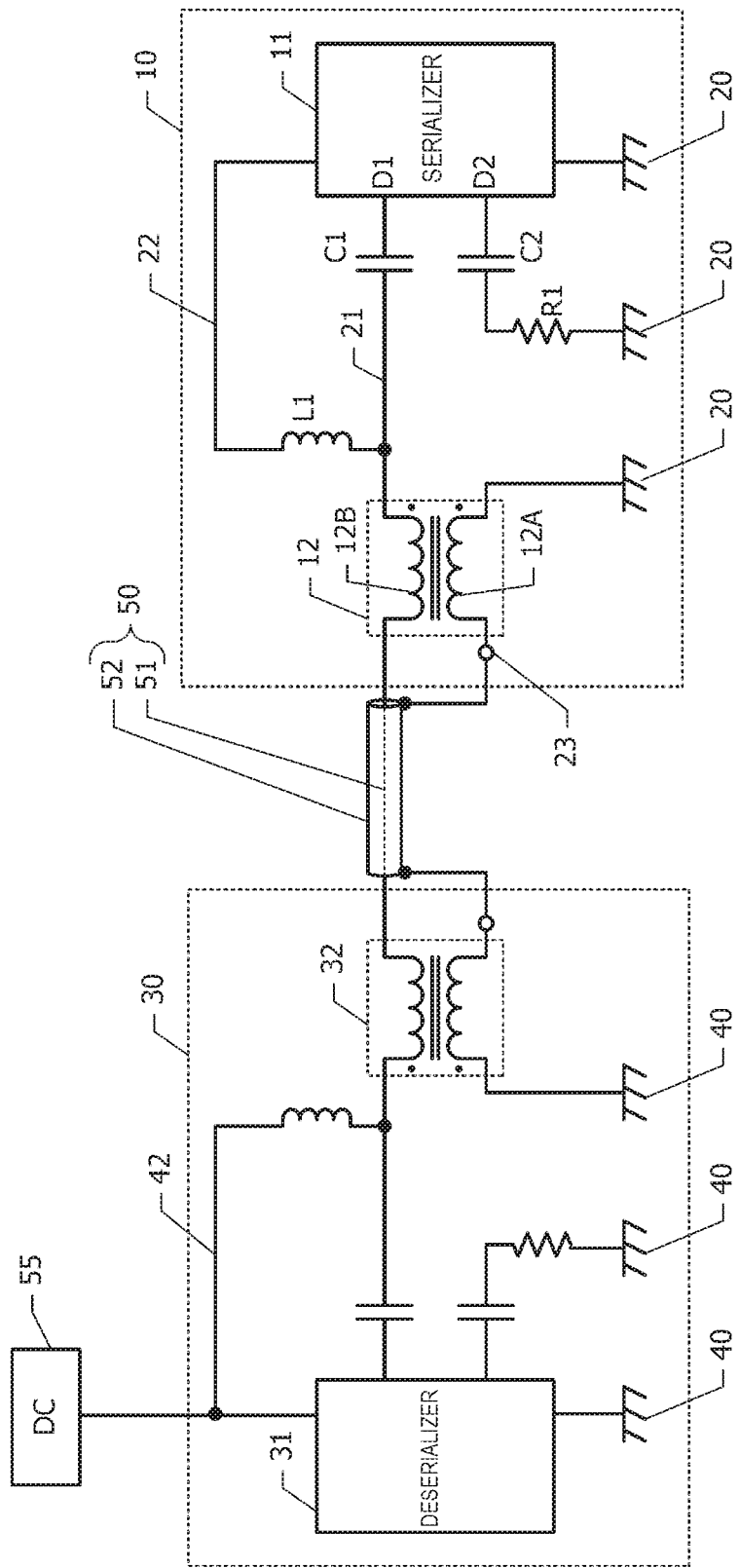
FIG. 1 is an equivalent circuit diagram of a serializer circuit module, a deserializer circuit module, and a coaxial cable connecting the serializer circuit module and the deserializer circuit module, according to a first example.

FIG. 1 is a schematic equivalent circuit diagram of a serializer circuit module 10, a deserializer circuit module 30, and a coaxial cable 50 connecting the serializer circuit module 10 and the deserializer circuit module 30, according to the first example A serializer 11 is mounted on the serializer circuit module 10 as a communication element that sends or receives a signal, and a peripheral circuit of the serializer 11 is further mounted on the serializer circuit module 10. A deserializer 31 is mounted on the deserializer circuit module 30 as a communication element, and a peripheral circuit of the deserializer 31 is further mounted on the deserializer circuit module 30.

The difference between the serializer circuit module 10 and the deserializer circuit module 30 is whether the communication element being mounted is the serializer 11 or the deserializer 31, but the serializer circuit module 10 and the deserializer circuit module 30 are identical in basic circuit configuration. The configuration of the serializer circuit module 10 is described below, and with regard to the configuration of the deserializer circuit module 30, the duplicate description is omitted.

Next, the configuration of the serializer circuit module 10 is described. The serializer 11, a common-mode choke coil 12, and other peripheral circuit components are mounted on a wiring board on which a ground plane 20, a signal line 21, a power supply line 22, and a conductive pattern 23 are provided. The serializer 11 includes a first signal terminal D1 and a second signal terminal D2, which form a pair of signal terminals. The serializer 11 converts an input parallel signal into a serial signal and sends out the serial signal from the pair of the first signal terminal D1 and the second signal terminal D2. The first signal terminal D1 is connected to an inner conductor 51 of the coaxial cable 50 via the signal line 21. A first capacitor C1 is inserted in series in the signal line 21 between the common-mode choke coil 12 and the first signal terminal D1. The second signal terminal D2 is connected to the ground plane 20 via a series circuit of a second capacitor C2 and a termination resistor R1.

The first signal terminal D1 and the second signal terminal D2 may also be used for differential transmission. One of differential signals sent from the first signal terminal D1 is transmitted to the inner conductor 51 of the coaxial cable 50 via the signal line 21. Since the second signal terminal D2 is terminated by the termination resistor R1, the other differential signal sent from the second signal terminal D2 hardly produces any reflection. Accordingly, the configuration in which the second signal terminal D2 is terminated by the termination resistor R1 is effective for more stable operation of the serializer 11 that outputs differential signals from the first signal terminal D1 and the second signal terminal D2.

The conductive pattern 23 is connected to an outer conductor 52 of the coaxial cable 50. One of coils of the common-mode choke coil 12, or a coil 12A, connects the ground plane 20 and the conductive pattern 23. The other coil of the common-mode choke coil 12, or a coil 12B, is inserted in the signal line 21. The first capacitor C1 is inserted in the signal line 21 between the common-mode choke coil 12 and the serializer 11. The signal line 21 between the common-mode choke coil 12 and the first capacitor C1 is connected to the power supply line 22 via an inductor L1. A direct-current power is supplied from the power supply line 22 to the serializer 11.

The first capacitor C1 cuts a direct current and allows a high frequency signal to pass through. The inductor L1 cuts a high frequency signal and allows a direct current to pass through.

A direct-current power supply 55 supplies power to a power supply line 42 of the deserializer circuit module 30. The power supply line 42 of the deserializer circuit module 30 is connected DC-wise with low impedance to the power supply line 22 of the serializer circuit module 10 via a common-mode choke coil 32, the inner conductor 51 of the coaxial cable 50, and the common-mode choke coil 12. A ground plane 40 of the deserializer circuit module 30 is connected DC-wise with low impedance to the ground plane 20 of the serializer circuit module 10 via the outer conductor 52 of the coaxial cable 50. The direct-current power supply 55 supplies power to the serializer circuit module 10 via the deserializer circuit module 30 and the coaxial cable 50. The serializer circuit module 10, the deserializer circuit module 30, the coaxial cable 50, and the direct-current power supply 55 constitute a network module that enables sending and receiving of a serial signal and supplying of a direct-current power.

The first example illustrated in FIG. 1 employs a single-end transmission system in which the ground is shared by the serializer circuit module 10 and the deserializer circuit module 30 and a signal is transmitted using a single transmission line.

Figure 2:
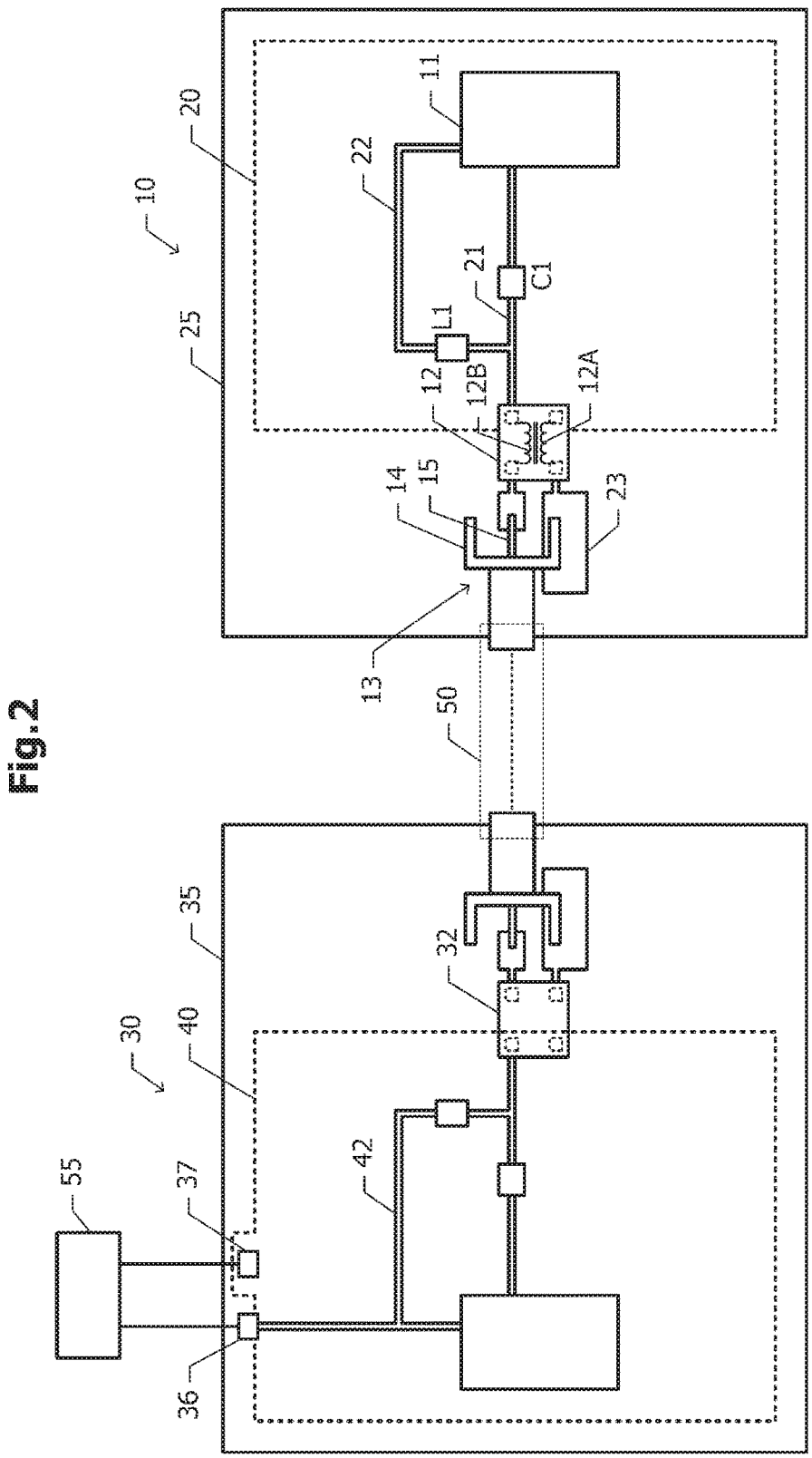
FIG. 2 is a schematic plan view of a serializer circuit module and a deserializer circuit module according to the first example.

FIG. 2 is a schematic plan view of the serializer circuit module 10 and the deserializer circuit module 30. The serializer circuit module 10 and the deserializer circuit module 30 are different from each other in arrangement of the circuit components and in arrangements and shapes of the ground plane, the conductive pattern, the signal line, the power supply line, and the like. However, in terms of the equivalent circuit diagram, only the difference between the serializer circuit module 10 and the deserializer circuit module 30 is whether the communication element being mounted is the serializer 11 or the deserializer 31, and there is no difference in configuration of the remaining part. Accordingly, the configuration of the serializer circuit module 10 is described below, and with regard to the configuration of the deserializer circuit module 30, the duplicate description is omitted.

The ground plane 20, the signal line 21, the power supply line 22, and the conductive pattern 23 are provided on a printed wiring board 25. The signal line 21 and the ground plane 20 are placed on a topside surface and a backside surface of the printed wiring board 25, respectively. The signal line 21 and the ground plane 20 constitute a microstrip line. The serializer 11, the common-mode choke coil 12, and a receptacle 13 for a coaxial cable are mounted on the printed wiring board 25. When a plug connector of the coaxial cable 50 (FIG. 1) is connected to the receptacle 13, a shell conductor 14 and a center conductor 15 of the receptacle 13 are connected to the outer conductor 52 and the inner conductor 51 (FIG. 1) of the coaxial cable 50, respectively.

The shell conductor 14 is connected mechanically and electrically to the conductive pattern 23 using solder or the like. The center conductor 15 is electrically connected to an end portion of the signal line 21. The conductive pattern 23 is independent from the ground plane 20. In other words, the conductive pattern 23 is not connected to the ground plane 20 by means of wiring or the like in the printed wiring board 25 and is isolated from the ground plane 20.

The coil 12A, which is one of coils of the common-mode choke coil 12, connects the conductive pattern 23 and the ground plane 20. The coil 12B, which is the other coil of the common-mode choke coil 12, is inserted in the signal line 21. That is, the signal line 21 is divided, and signal lines 21 on both sides of a dividing part are connected via the coil 12B.

The first capacitor C1 is mounted on the signal line 21 in series between the common-mode choke coil 12 and the serializer 11. The power supply line 22 branches off from the signal line 21 between the common-mode choke coil 12 and the first capacitor C1. The inductor L1 is mounted on the power supply line 22 in series.

A power supply terminal 36 and a ground terminal 37 are provided on the printed wiring board 35 of the deserializer circuit module 30. The power supply terminal 36 is connected to the power supply line 42. The ground terminal 37 is connected to the ground plane 40. A positive electrode and a negative electrode of the direct-current power supply 55 are connected to the power supply terminal 36 and the ground terminal 37, respectively. In some cases, a DC-DC converter for stepping up or stepping down a voltage may be inserted in the power supply line 42.

FIG. 3A and FIG. 3B are elevation views and a bottom view of the common-mode choke coil 12 (FIG. 1, FIG. 2), respectively. Note that the common-mode choke coil 32 (FIG. 1, FIG. 2) also has the same configuration as the common-mode choke coil 12.

Flange parts 71 and 72 are provided on two sides of a core 70, respectively. A top plate 73 is placed from a top surface of one of the flange parts, or the flange part 71, to a top surface of the other flange part, or the flange part 72. Two conductive wires are wound around the core 70 in such a way that winding directions of the two conductive wires are the same. One of the conductive wires forms the coil 12A (FIG. 1, FIG. 2), which is one of the coils, and the other conductive wire forms the coil 12B (FIG. 1, FIG. 2), which is the other coil.

Outer electrodes 74 and 76 are provided on a bottom surface of the flange part 71, which is one of the flange parts, and outer electrodes 75 and 77 are provided on a bottom surface of the flange part 72, which is the other flange part. Four outer electrodes 74, 75, 76, and 77 are placed on positions corresponding to vertexes of a rectangle in the plan view. The outer electrode 74 and the outer electrode 75 correspond to two end portions of one of the sides, and the outer electrode 76 and the outer electrode 77 correspond to two end portions of the opposite side thereof. Two end portions of the coil 12A, which is one of the coils, are connected to the outer electrodes 74 and 75, respectively, and two end portions of the coil 12B, which is the other coil, are connected to the outer electrodes 76 and 77, respectively.

When mounting the common-mode choke coil 12 on the printed wiring board 25 (FIG. 2), the outer electrodes 74 and 75 are connected to the conductive pattern 23 and the ground plane 20, respectively. Further, the outer electrodes 76 and 77 are connected to the signal line 21 on the center conductor 15 side of the receptacle 13 and the signal line 21 on the serializer 11 side, respectively.

Next, advantageous effects of the first example are described. The mode of a normal-mode signal sent from the serializer 11 is sometimes converted inside the printed wiring board 25, and a common-mode noise component is generated. The common-mode noise component propagates through the signal line 21 and the coil 12A of the common-mode choke coil 12 in the same phase. Because of this, the common-mode noise component is suppressed by the common-mode choke coil 12 before the common-mode noise component leaks to the coaxial cable 50. This enables the reduction of radiation noise from the coaxial cable 50.

Similarly, a leakage of a common-mode noise component generated at the power supply line 42 of the deserializer circuit module 30 to the coaxial cable 50 can be suppressed.

Further, in the first example, the common-mode choke coils 12 and 32 are inserted at a connecting part of the serializer circuit module 10 and the coaxial cable 50 and a connecting part of the deserializer circuit module 30 and the coaxial cable 50, respectively. Since the common-mode choke coil 12 is placed immediately close to the receptacle 13 (FIG. 2), the radiation noise from the coaxial cable 50 can be suppressed effectively.

Further, since two common-mode choke coils 12 and 32 are inserted in series in a transmission path of signal from the serializer 11 to the deserializer 31, the transmission path has a higher impedance against the common-mode noise component. This enables to reduce mutual effects of common-mode noise on the serializer circuit module 10 and the deserializer circuit module 30.

The common-mode noise component can be suppressed by applying a ferrite core to the coaxial cable 50 (FIG. 1). However, compared with such configuration, the first example enables to suppress an increase in weight due to the ferrite core and the like. The common-mode noise component can be suppressed by applying a ferrite bead to both the signal line and the ground line. However, compared with such configuration, the first example enables to reduce effects on the integrity of signal's waveform.

Next, an evaluation experiment was performed to confirm advantageous effects of the first example is described with reference to FIG. 4, FIG. 5A and FIG. 5B.

Figure 4:
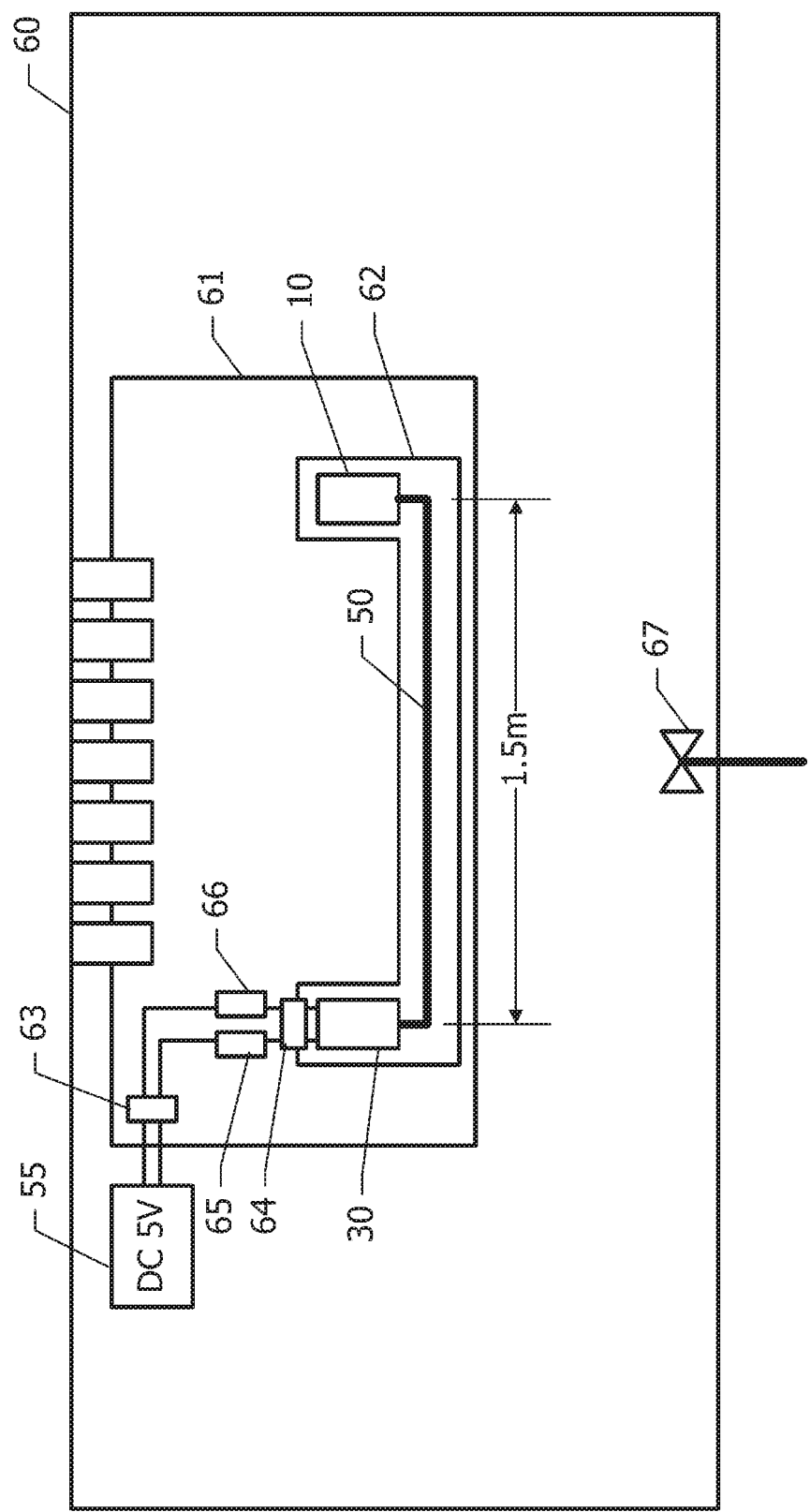
FIG. 4 is a schematic diagram of a measurement system employed in an evaluation experiment.

FIG. 4 is a schematic diagram of a measurement system employed in the evaluation experiment. This measurement system is compliance with CISPR25 Ed.3 standards. The measurement was taken in a radio-frequency anechoic chamber 60. A ground plane 61 was placed at a height of 90 cm from the floor. An insulating plate 62 having a thickness of 5 cm was placed on the ground plane 61, and on the insulating plate 62, a serializer circuit module 10, a deserializer circuit module 30, and a coaxial cable 50 connecting the serializer circuit module 10 and the deserializer circuit module 30 were placed. The length of the coaxial cable 50 was 1.5 m.

A 5 V direct-current power supply 55 supplied power to the deserializer circuit module 30 via power supply impedance stabilization circuits 65 and 66. Ferrite cores 63 and 64 were applied to a power supply cable.

An antenna 67 was placed at 1 meter away from the coaxial cable 50, and the radiation noise level from the coaxial cable 50 was measured. A biconical antenna was used for measurement of the radiation noise level in a frequency range between 30 MHz and 300 MHz inclusive, and a log periodic antenna was used for measurement of the radiation noise level in a frequency range between 300 MHz and 1000 MHz inclusive. A signal of 330 MHz (660 Mbps) was transmitted from the serializer circuit module 10 to the deserializer circuit module 30, and the radiation noise level was measured.

Figure 5A:
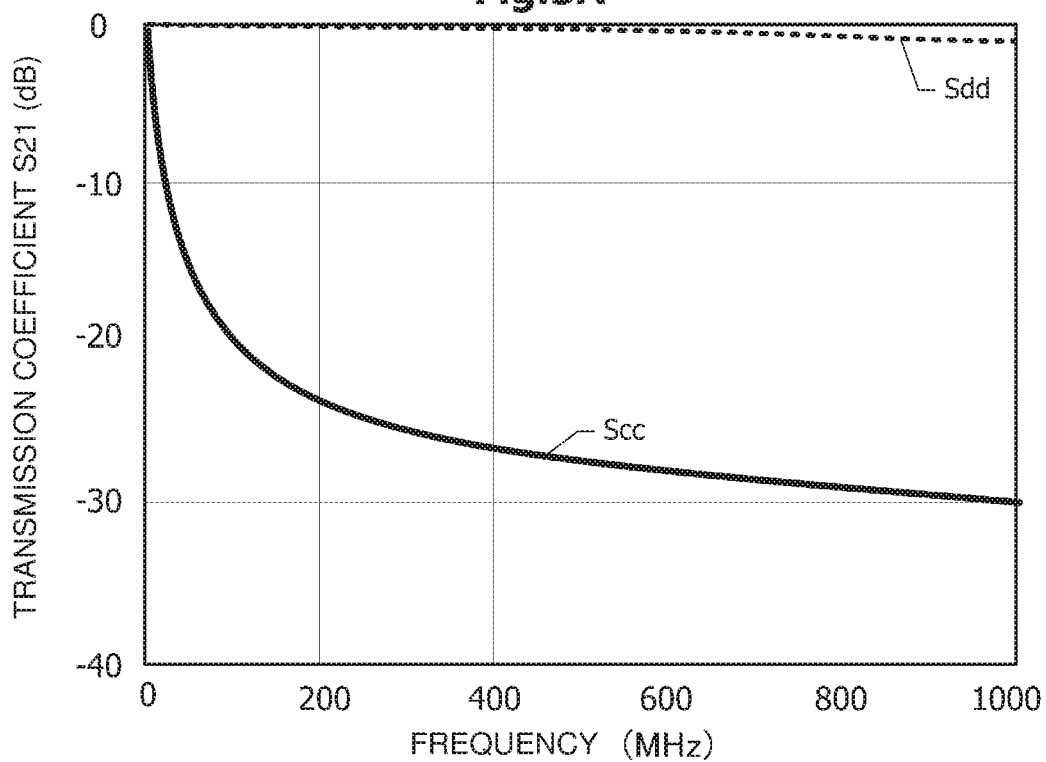
FIG. 5A is a graph illustrating characteristics of a common-mode choke coil mounted on the serializer circuit module and the deserializer circuit module, which are objects of an evaluation experiment.

FIG. 5A is a graph illustrating characteristics of common-mode choke coils 12 and 32 (FIG. 1) mounted on the serializer circuit module 10 and the deserializer circuit module 30, respectively. The horizontal axis represents the frequency in "MHz" unit, and the vertical axis represents the transmission coefficient S21 in "dB" unit. In the graph of FIG. 5A, a solid line Scc denotes the transmission coefficient of a common-mode component, and a dashed line Sdd denotes the transmission coefficient of a normal-mode component. The transmission coefficient of a normal-mode component is approximately 0 dB. The transmission coefficient of a common-mode component decreases as the frequency increases.

Figure 5B:
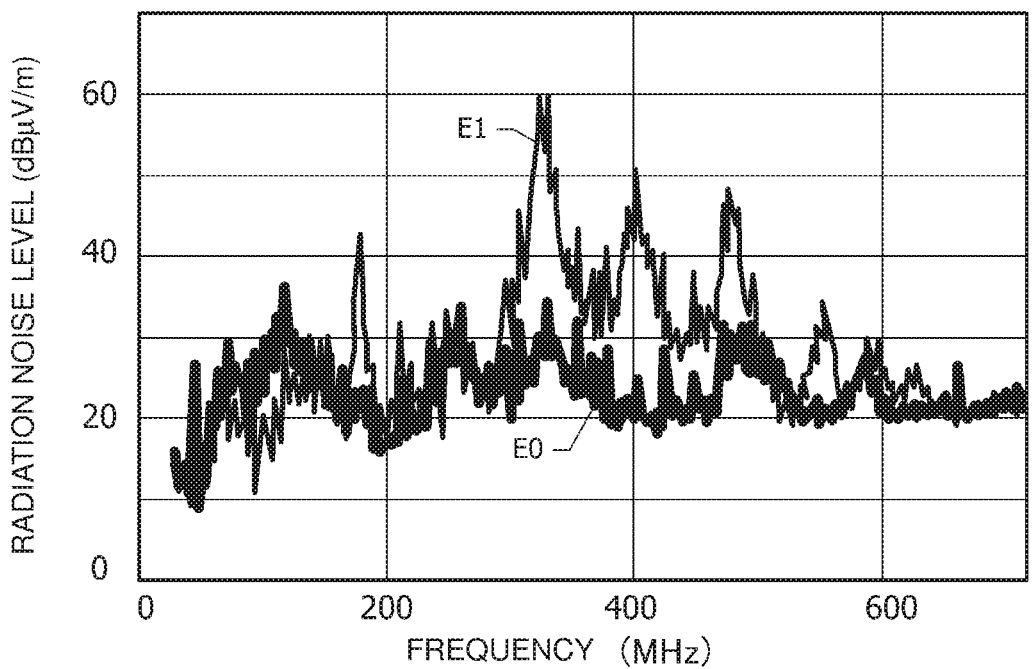
FIG. 5B is a graph illustrating a result of the evaluation experiment.

FIG. 5B is a graph illustrating a result of the evaluation experiment. The horizontal axis represents the frequency in "MHz" unit, and the vertical axis represents the radiation noise level in "dBμV/m" unit. A thick solid line E0 in the graph of FIG. 5B denotes measured values of the radiation noise level when the serializer circuit module 10 and the deserializer circuit module 30 according to the first example were used. A thin solid line E1 denotes measured values of the radiation noise level when the common-mode choke coils 12 and 32 were not placed.

Particularly, the reduction of the radiation noise level was confirmed in the frequency range between 300 MHz and 600 MHz inclusive.

It is conceivable that the common-mode noise in the single-end transmission system is generated because the ground on the sending-side module and the ground on the receiving-side module act as a dipole antenna. When the ground on the sending-side module and the ground on the receiving-side module act as a dipole antenna, part of a signal current does not flow through ground near a signal line but is routed through a floating electrostatic capacity. As described above, a signal current flowing a different path from the originally intended route becomes a cause of the common-mode noise.

To reduce the detouring of the signal current, it is considered that connecting the grounds of the sending-side module and the receiving-side module with low impedance and strengthening ground are preferable. Inserting the common-mode choke coil in series in the outer conductor of the coaxial cable connecting the ground of the sending-side module and the ground of the receiving-side module seems to contradict the idea of connecting the grounds together with low impedance. However, according to the foregoing result of the evaluation experiment, it was confirmed that a noise reduction effect was obtained in the frequency range between 300 MHz and 600 MHz inclusive by inserting the common-mode choke coil as in the first example.

Next, a first modified example of the first example is described with reference to FIG. 6A and FIG. 6B. In the first modified example, preferable electrostatic capacities of the first capacitor C1 and the second capacitor C2 (FIG. 1) are described.

Figure 6A:
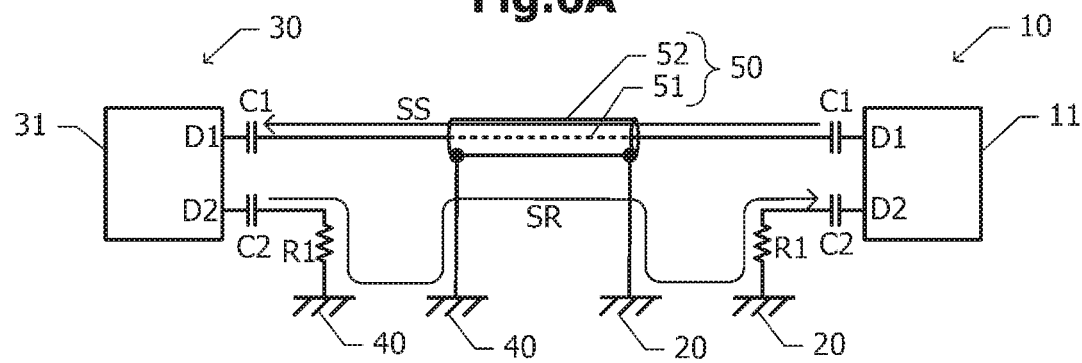
FIG. 6A is an equivalent circuit diagram for illustrating preferable electrostatic capacities of a first capacitor and a second capacitor.

FIG. 6A is an equivalent circuit diagram illustrating a transmission path of a high frequency signal between the serializer circuit module 10 and the deserializer circuit module 30 according to the first example. A high frequency signal SS is transmitted from the first signal terminal D1 of the serializer 11 to the first signal terminal D1 of the deserializer 31 through the signal line 21 and the inner conductor 51 of the coaxial cable 50. A return signal SR is transmitted from the second signal terminal D2 of the deserializer 31 through the ground plane 40, the outer conductor 52 of the coaxial cable 50, and the ground plane 20 through the second signal terminal D2 of the serializer 11.

Ideally, it is desirable that the high frequency signal SS and the return signal SR are at the same level. In this case, it is ideal to set the electrostatic capacity of the first capacitor C1 and the electrostatic capacity of the second capacitor C2 at the same value.

In the SerDes transmission system, it is desirable to enable sending and receiving of both a low frequency signal in a frequency band between several 100s kHz and several 10s MHz inclusive and a high frequency signal in a frequency band between several 100s MHz and several 10s GHz inclusive. Accordingly, it is desirable to determine the electrostatic capacities of the first capacitor C1 and the second capacitor C2 in such a way that the low frequency signal passes through.

Figure 6B:
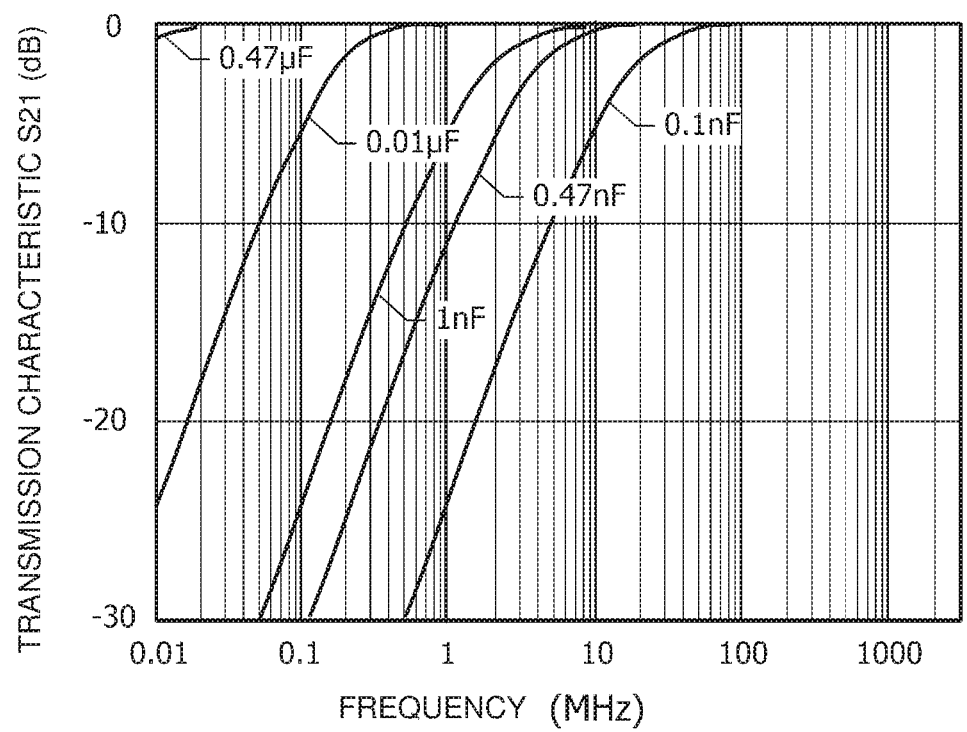
FIG. 6B is a graph illustrating a simulation result on frequency dependence of transmission coefficient S21 when varying the electrostatic capacities of the first capacitor and the second capacitor.

FIG. 6B is a graph illustrating a simulation result on frequency dependence of the transmission coefficient S21 of a circuit in which a capacitor is inserted between one of terminals of a first port of measuring instrument and one of terminals of a second port of measuring instrument. The horizontal axis represents the frequency in "MHz" unit, and the vertical axis represents the transmission coefficient S21 in "dB" unit. FIG. 6B illustrates the transmission coefficient S21 for the capacitor's electrostatic capacities of 0.1 nF, 0.47 nF, 1 nF, 0.01 μF, and 0.47 μF.

For example, in order to allow a signal of several 100s kHz to pass, it is found that both the first capacitor C1 and the second capacitor C2 preferably have an electrostatic capacity of 0.01 μF or larger. However, the electrostatic capacity does not need to increase more than necessary. For example, it is only necessary to set the electrostatic capacities of the first capacitor C1 and the second capacitor C2 at 0.47 μF or less.

Next, a second modified example of the first example is described. The first modified example addresses the case where the high frequency signal SS and the return signal SR are at the same level whereas the second modified example addresses the case where the high frequency signal SS and the return signal SR are not at the same level. When the impedance of the ground plane 20 or 40 for a high frequency signal is high and the ground is not stable, the ground potential varies because of a high-frequency return signal SR. The variation of the ground potential triggers a potential variation of the outer conductor 52 of the coaxial cable 50. The potential variation of the outer conductor 52 causes the generation of common-mode noise that flows the inner conductor 51 and the outer conductor 52 of the coaxial cable 50. As a result, the coaxial cable 50 acts as a noise radiation source, and the radiation noise increases.

In order to reduce the radiation noise, it is only necessary to stop the return signal SR from being transmitted to the ground plane 20 or 40. In order to stop the flow of the return signal SR to the ground plane 20 or 40, it is only necessary to remove the termination resistors R1 placed between the second capacitor C2 and the ground plane 20 or 40 to form an open-end. However, if the part of the termination resistor R1 is opened completely, the serializer 11 and the deserializer 31 sometimes do not operate properly.

Accordingly, it is desirable to reduce the return signal SR flowing to the ground plane 20 or 40 as much as possible while ensuring proper operation of the serializer 11 and the deserializer 31 by adjusting the electrostatic capacities of the first capacitor C1 and the second capacitor C2. In order to achieve such state, it is preferable that the electrostatic capacity of the second capacitor C2 is smaller than the electrostatic capacity of the first capacitor C1. As with the first modified example, in the second modified example, it is also preferable that both the electrostatic capacities of the first capacitor C1 and the second capacitor C2 are set in the range between 0.01 µF and 0.47 µF inclusive.

Next, another modified example of the first example is described.

In the first example, the second capacitor C2 is inserted between the second signal terminal D2 of the serializer 11 and the ground plane 20. However, when no direct current flows in and out the second signal terminal D2, there is no need for cutting a direct-current component. Thus, the part where the second capacitor C2 is inserted may be shunted. In this case, the second signal terminal D2 is connected to the ground plane 20 via the termination resistor R1.

In the first example, as illustrated in FIG. 2, the receptacle 13 for a coaxial cable is mounted on the printed wiring board 25 of the serializer circuit module 10. Alternatively, the receptacle 13 may be attached on a housing or the like. In this case, it is only necessary to connect the shell conductor 14 and the center conductor 15 of the receptacle 13, which is attached to the housing or the like, to the conductive pattern 23 and the signal line 21 using a cable or the like, respectively.

Further, in the first example, the direct-current power supply 55 is connected to the deserializer circuit module 30 (FIG. 1), and power is supplied from the deserializer circuit module 30 to the serializer circuit module 10 via the coaxial cable 50. Conversely, the direct-current power supply 55 may be connected to the serializer circuit module 10, and power may be supplied from the serializer circuit module 10 to the deserializer circuit module 30 via the coaxial cable 50. Alternatively, a power supply may be connected to both the serializer circuit module 10 and the deserializer circuit module 30.

The first example has the configuration such that a serial signal is sent from the serializer circuit module 10 to the deserializer circuit module 30. The technical ideas disclosed in the first example can be applied to other devices employing the single-end transmission system that uses a coaxial cable.

Second Example

Next, a circuit module according to a second example is described with reference to the drawings from FIG. 7A to FIG. 8B. In the following, the description of the configuration common to the first example is omitted.

Figures 7A, 7B:
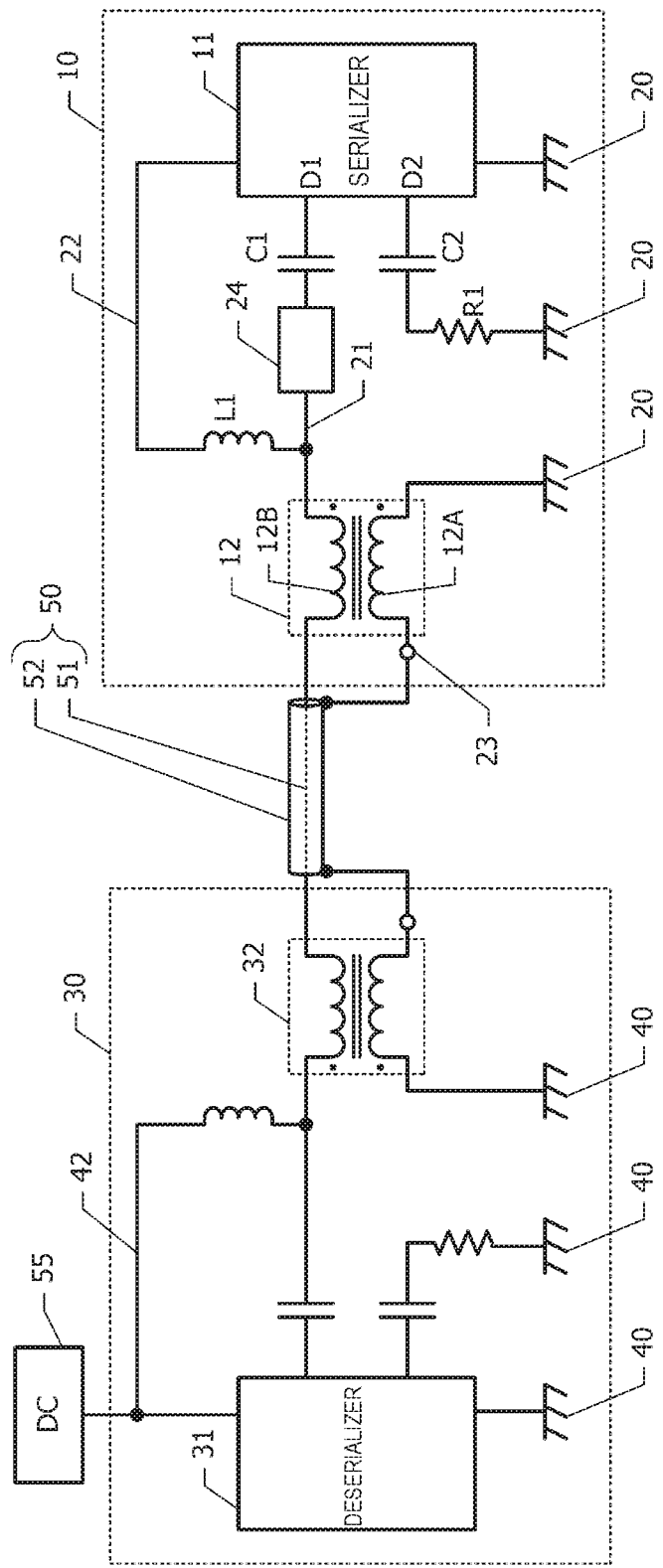
FIG. 7A is a schematic equivalent circuit diagram of a circuit module according to a second example.
FIG. 7B is an equivalent circuit diagram illustrating an example of a normal-mode noise filter.

FIG. 7A is a schematic equivalent circuit diagram of a circuit module according to the second example. In the second example, a normal-mode noise filter 24 is inserted in the signal line 21 of the serializer circuit module 10. The normal-mode noise filter 24 is inserted in the signal line 21 between the first capacitor C1 and a connecting point of the power supply line 22 and the signal line 21.

FIG. 7B is an equivalent circuit diagram illustrating an example of the normal-mode noise filter 24. As the normal-mode noise filter 24, for example, a T-type filter composed of an inductor L3, a ferrite bead FB, and a shunt capacitor C3 can be used. The inductor L3 and the ferrite bead FB are inserted in series in the signal line 21. Note that any one or two of the inductor L3, the ferrite bead FB, and the shunt capacitor C3 may be omitted.

An evaluation experiment was performed to confirm a noise suppression effect of the circuit module according to the second example. In the following, the evaluation experiment is described.

FIG. 8A is a graph illustrating a filter characteristic of the normal-mode noise filter 24 mounted on the serializer circuit module 10 used in the evaluation experiment. The horizontal axis represents the frequency in "MHz" unit, and the vertical axis represents the transmission coefficient S21 for a normal-mode signal in "dB" unit. It is found that the transmission coefficient S21 decreases as the frequency increases. However, the slope of decrease in transmission coefficient S21 is more gradual than the slope of decrease in transmission coefficient S21 for common-mode noise of the common-mode choke coil illustrated in FIG. 5A.

FIG. 8B is a graph illustrating a result of the evaluation experiment. The horizontal axis represents the frequency in "MHz" unit, and the vertical axis represents the radiation noise level in "dBµV/m" unit. The device used for measuring the radiation noise level is identical to the device illustrated in FIG. 4, and the measurement condition is identical to the measurement condition of the radiation noise level illustrated in FIG. 5B.

A thin solid line E0 in the graph of FIG. 8B denotes a measurement result of the radiation noise when the serializer circuit module 10 and the deserializer circuit module 30 according to the first example were used. A thick solid line E2 denotes a measurement result of the radiation noise when the serializer circuit module 10 and the deserializer circuit module 30 according to the second example were used. The frequency of a signal sent from the serializer circuit module 10 to the deserializer circuit module 30 was 330 MHz (660 Mbps).

It was confirmed that, by inserting the normal-mode noise filter 24, the radiation noise level was reduced in the frequency range between 800 MHz and 1000 MHz inclusive. As described above, inserting the normal-mode noise filter 24 enables further reduction of the radiation noise level.

Next, a modified example of the second example is described. In the second example, the normal-mode noise filter 24 is mounted on the serializer circuit module 10. Alternatively, the normal-mode noise filter may be mounted on the deserializer circuit module 30 or may be mounted on both the serializer circuit module 10 and the deserializer circuit module 30.

In the second example, the normal-mode noise filter 24 is inserted in the signal line 21 between the first capacitor C1 and the connecting point of the power supply line 22 and the signal line 21. Alternatively, the normal-mode noise filter 24 may be inserted in a different part. For example, the normal-mode noise filter 24 may be inserted in the signal line 21 between the common-mode choke coil 12 and the connecting point of the power supply line 22 and the signal line 21.

Further, in the second example, the normal-mode noise filter 24 is inserted in the signal line 21 to suppress the leakage of normal-mode noise to the coaxial cable 50. As an alternative configuration, the common-mode choke coil 12 may have an impedance (normal-mode impedance) for a normal-mode signal to the extent that the waveform of a signal is maintained. For example, a common-mode choke coil that has the transmission characteristic illustrated in FIG. 5A for a common-mode signal and the transmission characteristic illustrated in FIG. 8A for a normal-mode signal may be used. An example of such common-mode choke coil is disclosed in Japanese Unexamined Patent Application Publication No. 2009-182055.

As described above, by allowing the common-mode choke coil to have a normal-mode impedance in a certain frequency range, advantageous effects similar to those in the second example can be obtained without inserting the normal-mode noise filter 24 (FIG. 7A). As a result, it becomes possible to reduce the number of components.

Third Example

Figure 9A:
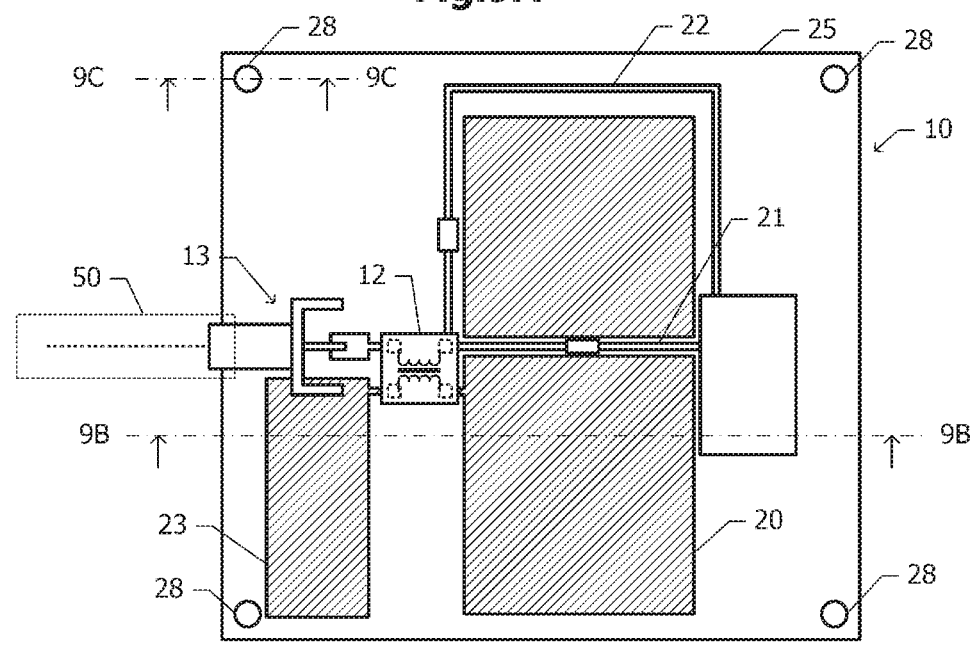
FIG. 9A is a plan view of a serializer circuit module according to a third example.
Figure 9B:
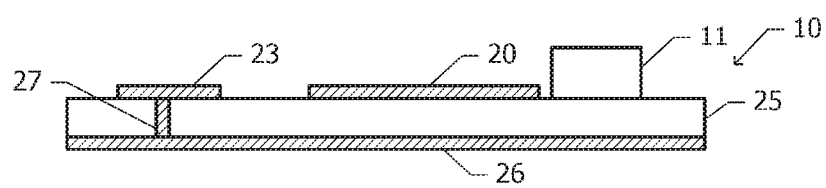
FIG. 9B is a cross-sectional view of FIG. 9A along a dashed-dotted line 9B-9B.
Figure 9C:
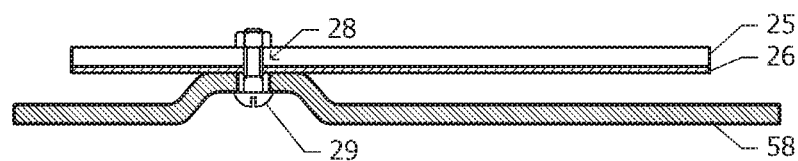
FIG. 9C is a cross-sectional view of FIG. 9A along a dashed-dotted line 9C-9C in a state where the serializer circuit module is attached to a chassis.

Next, a serializer circuit module 10 is described as an example of a circuit module according to a third example with reference to the drawings from FIG. 9A to FIG. 9C. The description regarding the configuration common to the serializer circuit module 10 (FIG. 1 and FIG. 2) according to the first example is omitted below.

FIG. 9A is a plan view of a serializer circuit module 10 according to the third example. FIG. 9B is a cross-sectional view of FIG. 9A along a dashed-dotted line 9B-9B. In the first example, the ground plane 20 (FIG. 2) is placed on an inner layer or the backside surface of the printed wiring board 25, and the signal line 21 and the ground plane 20 constitute a microstrip line. In the third example, the signal line 21 and the ground plane 20 are placed on the same surface of the printed wiring board 25, and the signal line 21 and the ground plane 20 constitute a coplanar line. The power supply line 22 is placed so as not to overlap the ground plane 20.

Another ground plane 26 is placed on the backside surface of the printed wiring board 25. The ground plane 26 is connected to the conductive pattern 23 on the topside via a via conductor 27. The ground plane 20 on the topside and the ground plane 26 on the backside are not directly connected to each other, but connected via the common-mode choke coil 12. In the plan view, the ground plane 20 on the topside overlaps the ground plane 26 on the backside.

A plurality of through holes 28 is provided in the printed wiring board 25 for attachment to a chassis.

FIG. 9C is a cross-sectional view of FIG. 9A along a dashed-dotted line 9C-9C. The printed wiring board 25 is fixed to a chassis 58 made of a metal using a screw 29 that passes a through hole in the chassis 58 and the through hole 28 in the printed circuit board 25. In this state, the ground plane 26 comes in contact with the chassis 58. As a result, the ground plane 26 is shunted to the chassis 58 and functions as a frame ground.

Next, advantageous effects of the third example are described. In the first example, the conductive pattern 23 (FIG. 2) functions as ground on the coaxial cable 50 side. When the common-mode choke coil 12 is placed immediately close to the receptacle 13 for reducing the radiation noise, it is difficult to enlarge the conductive pattern 23. Because the conductive pattern 23 that functions as ground is small, the ground of the coaxial cable 50 becomes unstable.

In response to this, in the third example, the ground plane 26 (FIG. 9B) shunted to the outer conductor 52 of the coaxial cable 50 functions as the ground on the coaxial cable 50 side. The ground plane 26 is placed on a location different from the location of the ground plane 20 in a thickness direction of the printed wiring board 25. Thus, it is possible to enlarge the ground plane 26 while overlapping the ground plane 20. Compared with the configuration of the first example, enlarging the ground plane 26 enables to strengthen the ground of the coaxial cable 50.

Next, a modified example of the third example is described. In the third example, the printed wiring board 25 (FIG. 9C) is fixed to the metallic chassis 58 (FIG. 9C). Alternatively, instead of the metallic chassis 58, a housing including a conductive member may be used. For example, using a resin housing including copper foil, the ground plane 26 (FIG. 9C) of the printed wiring board 25 may be electrically connected to the copper foil. Note that the copper foil is not necessarily in close contact with a resin member, and a gap may be formed between the copper foil and the resin member. Alternatively, using a housing in which a metal layer is provided on a resin surface by vapor deposition, the ground plane 26 (FIG. 9C) of the printed wiring board 25 may be electrically connected to the metal layer.

Fourth Example

Next, an in-vehicle electronic device according to a fourth example are described with reference to FIG. 10A and FIG. 10B.

Figure 10A:
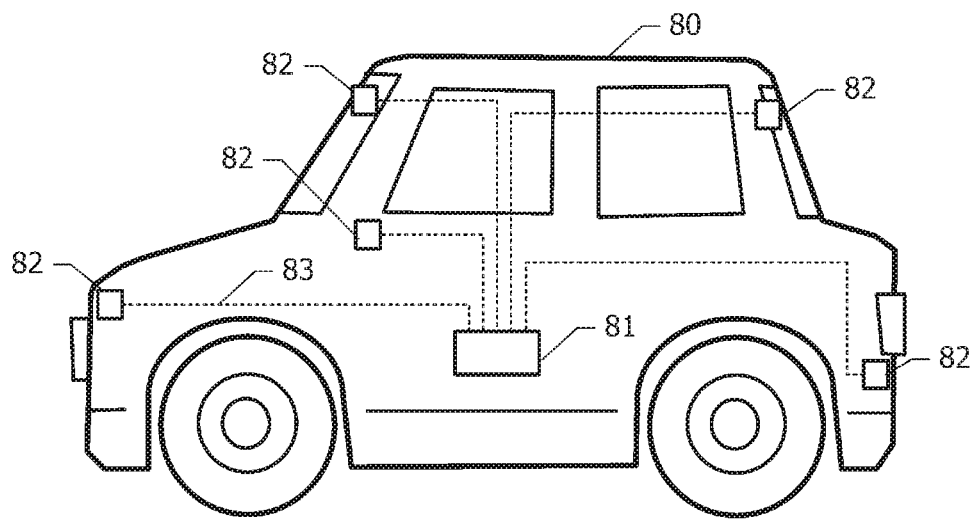
FIG. 10A is a schematic diagram of a vehicle and an in-vehicle electronic device installed in the vehicle, according to a fourth example.

FIG. 10A is a schematic diagram of a vehicle 80 and an in-vehicle electronic device installed in the vehicle 80. An electronic control unit (ECU) 81 serving as the in-vehicle electronic device and a plurality of cameras 82 are installed in the vehicle 80. The electronic control unit 81 is connected to each of the plurality of cameras 82 using a coaxial cable 83, and control signals and image signals are sent and received between the electronic control unit 81 and each of the plurality of cameras 82. In sending and receiving of these signals, the SerDes transmission system is applied.

Figure 10B:
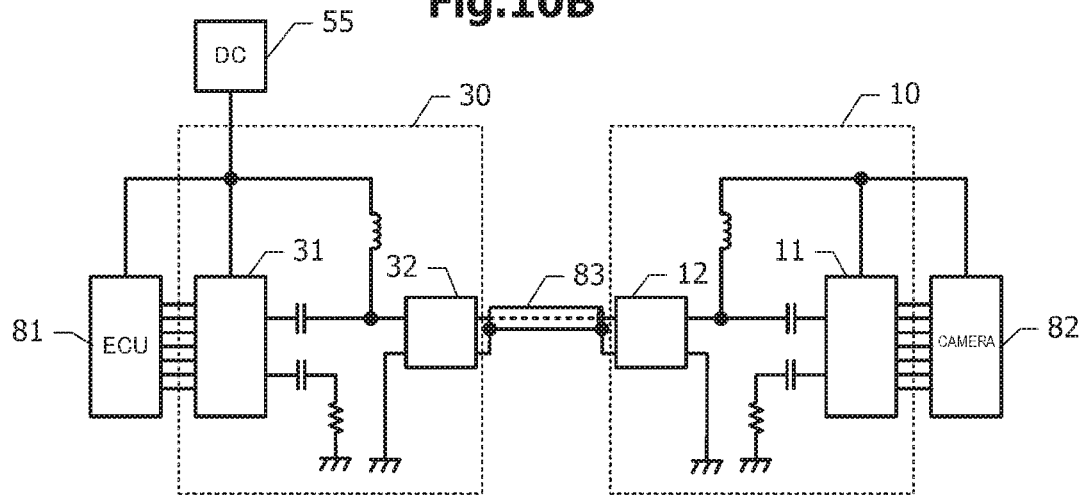
FIG. 10B is a block diagram illustrating a connection system for an electronic control unit exemplifying an in-vehicle electronic device and one camera.

FIG. 10B is a block diagram illustrating a connection system for the electronic control unit 81 and one of the plurality of cameras 82. The camera 82 and the serializer 11 of the serializer circuit module 10 are connected via a parallel interface. The deserializer 31 of the deserializer circuit module 30 and the electronic control unit 81 are connected via a parallel interface. As the serializer circuit module 10 and the deserializer circuit module 30, the serializer circuit module 10 and the deserializer circuit module 30 according to any one of the first example, the second example, and the third example may be used.

The common-mode choke coil 12 of the serializer circuit module 10 and the common-mode choke coil 32 of the deserializer circuit module 30 are connected to each other using the coaxial cable 83. The direct-current power supply 55 supplies a direct-current power to the electronic control unit 81 and the deserializer 31. Further, the direct-current power supply 55 supplies direct-current power to the serializer 11 and the camera 82 via the common-mode choke coil 32, the coaxial cable 83, and the common-mode choke coil 12.

Image data obtained by the camera 82 is input to the serializer 11 via the parallel interface. The serializer 11 converts a parallel signal input from the camera 82 into a serial signal and sends the converted serial signal to the deserializer 31 via the coaxial cable 83. The deserializer 31 converts the received serial signal into a parallel signal. The converted parallel signal is input to the electronic control unit 81. In this way, the image data obtained by the camera 82 can be sent to the electronic control unit 81.

In the fourth example, the serializer circuit module 10 and the deserializer circuit module 30 according to any one of the first example, the second example, and third example are used. This enables the reduction of the radiation noise from the coaxial cable 83.

Needless to say, each of the foregoing examples and modification examples thereof is for illustrative purposes only and constituting elements of different examples may be partially exchanged or combined. Similar functions and effects produced by similar constituting elements in a plurality of the examples are not repeated in every example. Further, the present disclosure is not limited to the foregoing examples. For example, it is obvious to a person skilled in the art that various changes, improvements, combinations, and the like are possible.

What is claimed is:

1. A circuit module comprising:
    a wiring board on which a ground plane, a signal line, and a conductive pattern for connection to an outer conductor of a coaxial cable are provided, the coaxial cable including an inner conductor and the outer conductor;
    a common-mode choke coil mounted on the wiring board such that one of coils connects the ground plane and the conductive pattern and another of the coils is inserted in the signal line;
    a communication element including a first signal terminal and a second signal terminal, the first signal terminal being connected to the common-mode choke coil via the signal line, the second signal terminal being connected to the ground plane, and the second signal terminal and the common-mode choke coil being connected via the ground plane; and
    a first capacitor inserted in series in the signal line between the common-mode choke coil and the first signal terminal.

2. The circuit module according to claim 1, further comprising:
    a second capacitor connected between the second signal terminal and the ground plane.

3. An in-vehicle electronic device that uses the circuit module according to claim 2.

4. The circuit module according to claim 2, wherein an electrostatic capacity of the first capacitor is different from an electrostatic capacity of the second capacitor.

5. The circuit module according to claim 4, wherein the electrostatic capacity of the second capacitor is smaller than the electrostatic capacity of the first capacitor.

6. The circuit module according to claim 4, further comprising:
    a termination resistor connected in series to the second capacitor, wherein
    the second signal terminal is connected to the ground plane via a series circuit of the second capacitor and the termination resistor.

7. The circuit module according to claim 2, wherein an electrostatic capacity of the first capacitor is equal to an electrostatic capacity of the second capacitor.

8. The circuit module according to claim 2, further comprising:
    a termination resistor connected in series to the second capacitor, wherein
    the second signal terminal is connected to the ground plane via a series circuit of the second capacitor and the termination resistor.

9. The circuit module according to claim 7, further comprising:
    a receptacle mounted on the wiring board, the receptacle including a shell conductor and a center conductor for a coaxial cable, wherein
    the shell conductor of the receptacle is connected to the conductive pattern, and the center conductor of the receptacle is connected to the signal line.

10. The circuit module according to claim 7, further comprising:
    an inductor that connects the signal line between the common-mode choke coil and the first capacitor to a power supply line, wherein
    the power supply line is provided on the wiring board.

11. The circuit module according to claim 7, further comprising:
    another ground plane connected to the conductive pattern, the another ground plane overlapping the ground plane in a plan view.

12. The circuit module according to claim 7, further comprising:
    a termination resistor connected in series to the second capacitor, wherein
    the second signal terminal is connected to the ground plane via a series circuit of the second capacitor and the termination resistor.

13. The circuit module according to claim 2, further comprising:
    an inductor that connects the signal line between the common-mode choke coil and the first capacitor to a power supply line, wherein
    the power supply line is provided on the wiring board.

14. The circuit module according to claim 2, further comprising:
    a receptacle mounted on the wiring board, the receptacle including a shell conductor and a center conductor for a coaxial cable, wherein
    the shell conductor of the receptacle is connected to the conductive pattern, and the center conductor of the receptacle is connected to the signal line.

15. The circuit module according to claim 2, further comprising:
    another ground plane connected to the conductive pattern, the another ground plane overlapping the ground plane in a plan view.

16. The circuit module according to claim 1, further comprising:
    a receptacle mounted on the wiring board, the receptacle including a shell conductor and a center conductor for a coaxial cable, wherein
    the shell conductor of the receptacle is connected to the conductive pattern, and the center conductor of the receptacle is connected to the signal line.

17. The circuit module according to claim 1, further comprising:
    another ground plane connected to the conductive pattern, the another ground plane overlapping the ground plane in a plan view.

18. The circuit module according to claim 1, further comprising:
    an inductor that connects the signal line between the common-mode choke coil and the first capacitor to a power supply line, wherein
    the power supply line is provided on the wiring board.

19. A network module comprising:
    a serializer circuit module and a deserializer circuit module each having a same configuration as that of the circuit module according to claim 18;
    a coaxial cable that connects the signal line of the serializer circuit module and the signal line of the deserializer circuit module with an inner conductor and connects the conductive pattern of the serializer circuit module and the conductive pattern of the deserializer circuit module with an outer conductor; and
    a direct-current power supply,
    wherein the communication element of the serializer circuit module is a serializer that converts a parallel signal into a serial signal and sends out the serial signal to the signal line, the communication element of the deserializer circuit module is a deserializer that converts a serial signal received through the signal line into a parallel signal, and the direct-current power supply supplies power from the power supply line of the deserializer circuit module to the power supply line of the serializer circuit module via the coaxial cable.

20. An in-vehicle electronic device that uses the circuit module according to claim 1.

* * * * *